US011972788B2

(12) United States Patent
Meier et al.

(10) Patent No.: US 11,972,788 B2
(45) Date of Patent: Apr. 30, 2024

(54) APPARATUSES, SYSTEMS, AND METHODS FOR CONTROLLER DIRECTED TARGETED REFRESH OPERATIONS BASED ON SAMPLING COMMAND

(71) Applicant: MICRON TECHNOLOGY, INC., Boise, ID (US)

(72) Inventors: Nathaniel J. Meier, Boise, ID (US); Michael A. Shore, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 147 days.

(21) Appl. No.: 17/301,970

(22) Filed: Apr. 20, 2021

(65) Prior Publication Data

US 2022/0293169 A1 Sep. 15, 2022

Related U.S. Application Data

(60) Provisional application No. 63/159,869, filed on Mar. 11, 2021.

(51) Int. Cl.
| G11C 11/406 | (2006.01) |
| G11C 11/4076 | (2006.01) |
| G11C 11/408 | (2006.01) |

(52) U.S. Cl.
CPC .. *G11C 11/40622* (2013.01); *G11C 11/40615* (2013.01); *G11C 11/4076* (2013.01); *G11C 11/4085* (2013.01); *G11C 11/4087* (2013.01)

(58) Field of Classification Search
None
See application file for complete search history.

(56) References Cited

U.S. PATENT DOCUMENTS

| 2003/0115405 A1* | 6/2003 | Funyu | G11C 11/40618 |
| | | | 711/167 |
| 2004/0027900 A1* | 2/2004 | Lee | G11C 7/1051 |
| | | | 365/222 |
| 2014/0006704 A1* | 1/2014 | Greenfield | G06F 11/004 |
| | | | 711/106 |
| 2014/0297986 A1* | 10/2014 | Lee | G11C 8/08 |
| | | | 711/167 |
| 2016/0086649 A1* | 3/2016 | Hong | G11C 29/783 |
| | | | 365/96 |
| 2016/0133314 A1* | 5/2016 | Hwang | G11C 11/40611 |
| | | | 365/189.02 |
| 2017/0186481 A1* | 6/2017 | Oh | G11C 11/40615 |
| 2019/0228813 A1* | 7/2019 | Nale | G11C 11/40611 |
| 2019/0228815 A1* | 7/2019 | Morohashi | G11C 16/349 |

(Continued)

*Primary Examiner* — J. H. Hur
(74) *Attorney, Agent, or Firm* — Dorsey & Whitney LLP

(57) ABSTRACT

Apparatuses, systems, and methods for controller directed targeted refresh operations. A memory may be coupled to a controller. The memory may identify aggressor addresses based on sampled addresses. The addresses may be sampled based on internal timing logic of the memory and also based on a sampling command received from the controller. The memory may also receive a controller identified aggressor address from the controller. The memory may refresh one or more victim word lines of the identified (either by the memory or the controller) aggressor addresses as part of a targeted refresh operation. Victims of controller identified aggressor addresses may be refreshed before memory identified aggressor addresses.

17 Claims, 7 Drawing Sheets

(56) References Cited

U.S. PATENT DOCUMENTS

2020/0388326 A1* 12/2020 He .................... G11C 11/40618
2022/0113868 A1* 4/2022 Cowles ............. G11C 11/40611
2022/0189535 A1* 6/2022 Kim .................... G11C 11/4078

* cited by examiner

APPARATUSES, SYSTEMS, AND METHODS FOR CONTROLLER DIRECTED TARGETED REFRESH OPERATIONS BASED ON SAMPLING COMMAND

CROSS REFERENCE TO RELATED APPLICATION(S)

This application claims priority to U.S. Provisional Application No. 63/159,869 filed Mar. 11, 2021. The aforementioned application is incorporated herein by reference, in its entirety, for any purpose.

BACKGROUND

Semiconductor devices may include a controller and a memory. The controller may operate the memory, for example by providing commands to the memory and sending and receiving data to and from the memory. The memory may be a volatile memory in which the information stored therein may decay over time. The memory may carry out a self-refresh operation to restore the information before it can decay. Certain patterns of commands sent by the controller may increase the rate at which information decays in the memory. It may be useful to track the patterns of commands, such as the locations in the memory array those commands are executed on, in order to identify locations with increased rates of information decay so that those memory cells can be refreshed before data loss occurs.

DETAILED DESCRIPTION

Figure 1:
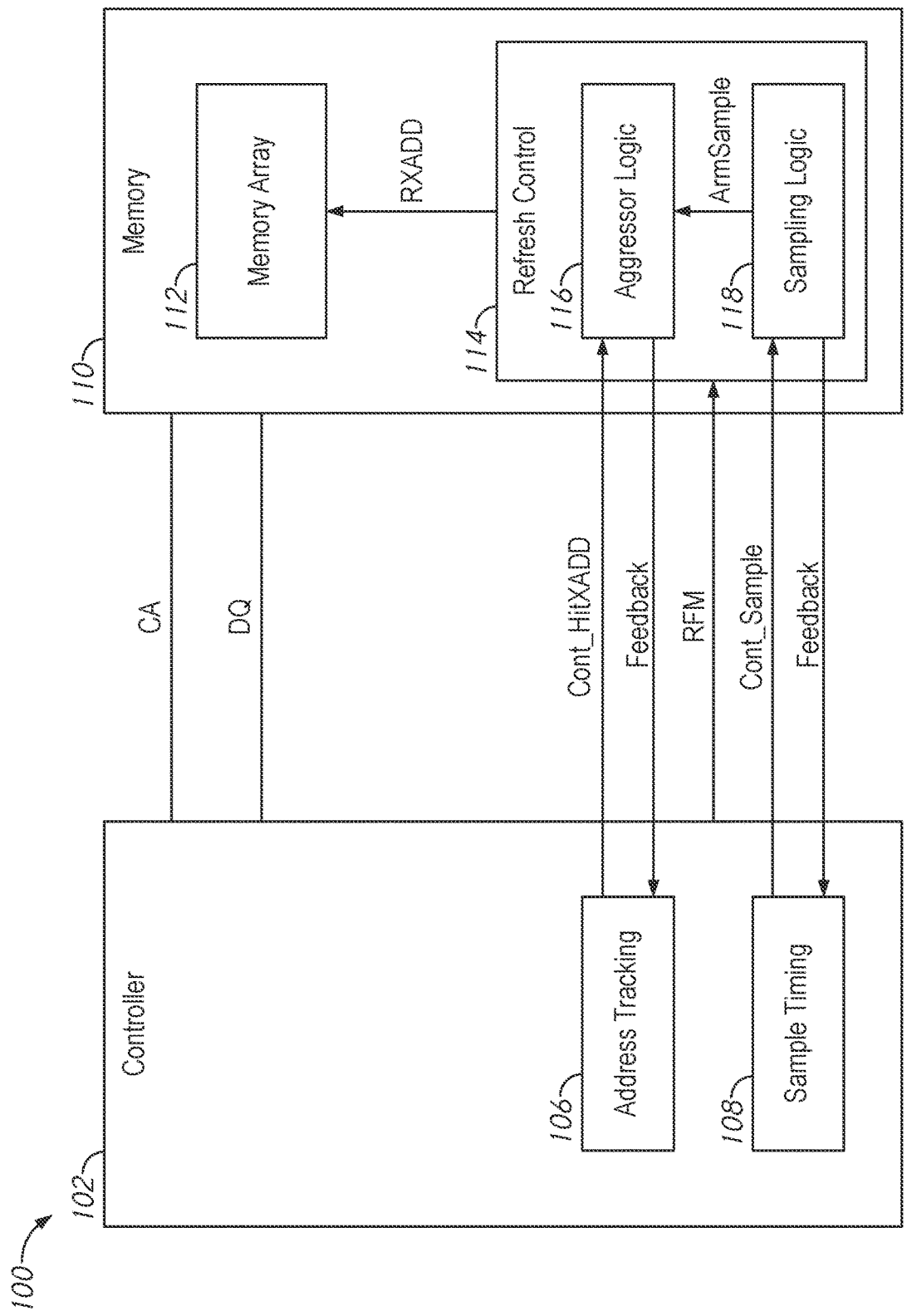
FIG. 1 is a block diagram of a system according to some embodiments of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory may be operated by a controller, which may provide various signals to the memory. For example, the controller may perform a read command by provide a read command and addresses along a command/address (CA) bus. The addresses may specify where in the memory array of the memory that the data should be read from. The memory may provide the data from the specified location along a data (DQ) bus. The controller may perform a write operation by providing a write command and addresses along the CA bus, and may receive the read information along the DQ bus.

The memory may store information in memory cells of the memory array. The memory cells may be arranged at the intersection of word lines (rows) and bit lines (columns or digit lines). Accordingly, row and column addresses may be used by the controller to specify the location of one or more memory cells. The memory array may be volatile, and the information in the memory cells may decay over time. The memory may refresh information (e.g., on a row-by-row basis) to restore the information before it can decay beyond the point of recovery. Certain patterns of access may increase the rate at which the information decays. For example, repeated access to a given row (an aggressor row) may increase the rate at which information decays in neighboring rows (victim rows). Various other attacks are also possible, which may cause an increased rate of data degradation in the victims of the attack. The memory may track accesses in order to identify aggressor rows based on one or more attack patterns, such that their victims may be refreshed.

In some circumstances, the attack may be inadvertent, and may be caused by the controller accessing the memory in a manner which causes an increased rate of information decay in some cells. In some circumstances, a malicious actor may deliberately attack the memory by instructing the controller to behave in a manner which causes increased rate of data decay, for example as part of an effort to manipulate or gain access to the data stored in the memory. For brevity, both types of access patters (deliberate and inadvertent) may be referred to as an attack. Similarly, it should be understood that there may be many different types of attack.

The memory may include various logic to identify one or more attack patterns associated with one or more types of attack. For example, the memory may sample a value of a row address and then determine if a sampled address is an aggressor or not based, in part, on a number of times that address has been sampled. It may be important to allow for increased flexibility in the manner in which the attacks are detected. For example, if a hacker determines how to circumvent the attack detection logic of the memory, it may be difficult to vary the logic that the memory uses to monitor attacks. Accordingly, it may be important to provide a redundant method of varying the attack detection logic, to allow for repair of the security flaw.

The present disclosure is drawn to apparatuses, systems, and methods for controller directed targeted refresh operations. The controller may perform one or more operations related to aggressor detector in parallel to the memory, and/or may operate the memory to cause aggressor detection operations to occur with timing based on logic in the controller. A memory may include a refresh control circuit which manages tracking access patterns to various row addresses in order to determine if they are aggressor addresses. The refresh control circuit may sample a current row address based on internal logic (e.g., with random timing, pseudo-random timing, semi-random timing, periodic timing, or combinations thereof). The controller may provide a controller sampling command which also causes the memory to sample the current value of the row address. The controller may generate the controller sampling signal based on logic internal to the controller. The use of independent sampling logic in the controller may decrease the predictability of the timing of the sampling operation. It may be easier to change the operation of the controller in case it becomes necessary to overcome a newly discovered vulnerability in the sampling pattern of the memory.

In some embodiments, both the memory and the controller may separately track addresses to locate aggressors. The controller may provide an identified aggressor address to the memory. The memory may include an aggressor storage structure, which stores the aggressor addresses identified by internal logic of the memory, as well as any aggressor addresses provided by the controller. The memory may then refresh victim addresses associated with the stored aggressor address(es). In some embodiments, the memory may refresh aggressors from different sources with different priority. For example, aggressor addresses provided by the controller may have their victims refreshed before aggressors identified by the memory. In some embodiments, the controller may specify the priority of the controller identified aggressor address. It may be easier to alter the aggressor detection logic of the controller (e.g., to overcome a security vulnerability in the aggressor detection logic of the memory, to change which type(s) of attack are monitored) which may improve the security and performance of the system.

FIG. 1 is a block diagram of a system according to some embodiments of the present disclosure. The system 100 includes a controller 102 and a memory 110. The controller 102 operates the memory 110. For example, the controller 102 provides commands and addresses across a command/address (CA) bus. The commands may instruct the memory to perform (or stop performing) an operation, and the addresses may indicate which memory cells the operation should be performed on (e.g., if the operation is associated with one or more memory cells). The controller 102 may also send and receive data to and from the memory 110 along a data (DQ) bus.

The controller 102 may represent a processing unit. For example, the controller 102 may be a microprocessor, central processing unit, or graphics processing unit. In some embodiments, the controller 102 and memory 110 may be packaged together (e.g., both may be mounted on a graphics card). In some embodiments, the controller 102 and memory 110 may be separate components which are coupled together as part of a computing system.

The buses (along with other signal lines, as discussed further herein) may be conductive elements which couple a terminal (e.g., a pin) of the controller 102 to an associated terminal (e.g., a pin) of the memory 110. Each bus may include one or more conductive elements, coupled between one or more pins. Voltages may be used to represent the level of a signal along the bus. For example, a first voltage may represent a first logical level, a second voltage may represent a second logical level, etc. Each bus may transmit one or more bits of information in parallel (along multiple conductive elements), in series (e.g., a first bit at a first time, a second bit at a second time), encoded in a level of the voltage (e.g., if the voltage has four levels, it may represent the state of two bits), or combinations thereof.

The memory 110 includes a memory array 112 which includes a number of memory cells arranged at the intersection of word lines (rows) and bit lines (digit lines or columns). Accordingly, a memory cell may be specified by a row address and column address. The memory array 112 may also be split into one or more banks, and a bank address may also be used to specify a bank. For example, as part of a read operation, the controller 102 may provide a read command along with a row address, column address, and bank address along the CA bus. The memory 110 may respond by reading information from the memory cell(s) of the memory array 112 which are associated with the row, column, and bank address(es) and provide that information along the DQ bus.

The information stored in the memory cells may decay over time. Accordingly, the memory 110 may refresh information stored in the memory array 112 to prevent information stored therein from being lost. The memory 110 includes a refresh control circuit 114 which manages refreshing the memory array 112. For example, the memory array 112 may be refreshed on a row-by-row basis, and the refresh control circuit 114 may provide a refresh address RXADD which indicates one or more rows of the memory array 112. A row decoder (not shown) may then refresh the memory cells along the row(s) indicated by the refresh address RXADD.

The refresh control circuit 114 may include aggressor logic 116, which may include an aggressor detector circuit and an aggressor refresh queue. The aggressor logic 116 may monitor addresses in order to determine if access patterns to one or more rows of the memory array 112 are causing an increase rate of data decay in other rows of the memory array 112 (e.g., due to an attack). The aggressor logic 116 may identify such aggressor rows and then generate refresh addresses RXADD based on the victims of those aggressors.

It may be impractical for the aggressor logic 116 to track all addresses passed along the CA bus. Instead, the aggressor logic 116 may track sampled addresses. The refresh control circuit 114 may include a sampling logic circuit 118 may generate a sampling signal ArmSample. When the sampling signal ArmSample is provided, the aggressor logic 116 may sample the current (or next) value of the row address. For example, the next time a signal associated with an access operation (e.g., ACT or Pre) is active, the value of the row address associated with that access operation is sampled. The sampling logic 118 may use various internal logic to determine when to provide the sampling signal ArmSample. For example, the sampling logic 118 may provide the signal ArmSample with random timing, semi-random timing, pseudo-random timing, event-based timing, event counter-based timing, periodic timing, timing based on one or more signals, or combinations thereof.

It may be desirable for the timing of the sampling signal ArmSample to have a degree of unpredictability. However, over time, malicious actors may determine the operation of the sampling logic 118 in order to attempt to predict when the sampling signal ArmSample will be provided so that they can issue attacks which will go undetected (e.g., by issuing addresses in such a manner they will be unsampled or undersampled).

The controller 102 may include a sample timing circuit 108, which may provide a sampling command Cont_Sample. When the sampling command Cont_Sample is provided, the sampling logic 118 in the memory 110 may provide the signal ArmSample. Accordingly, the use of the sampling command Cont_Sample may add an additional source of the sampling signal beyond the timing logic of the sampling logic 118. While the sampling command Cont_Sample is shown as a separate signal line, it should be understood that the sampling command Cont_Sample may be provided using various existing buses. For example, the sampling command Cont_Sample may be provided along the CA bus, the DQ bus, and/or other signal lines between the controller 102 and memory 110.

In some embodiments, the sampling command Cont_Sample may be written to a mode register of the memory. For example, the sampling command Cont_Sample may be associated with a particular register of the mode register. The controller 102 may perform a mode register write operation to the register associated with Cont_Sample to set that register to an active level (e.g., at a high logical level). The sampling logic 118 of the memory 110 may check the mode register and may provide the signal ArmSample if the register associated with Cont_Sample is active. Based on the signal ArmSample being active, the address associated with the next access operation may be sampled.

In some embodiments, one or more signals in addition to the sample command Cont_Sample may influence the sampling logic 118. For example, when access commands such as ACT and Pre are provided by the controller 102, they may, in some circumstances, influence the sampling logic 118. For example, the first activation command ACT just after a first pre-charge command Pre, may cause the sampling logic 118 to provide the signal ArmSample in order to initialize the aggressor logic 116. The sampling command Cont_Sample may be separate from such signals. In some embodiments, the sampling command Cont_Sample may be independent of commands, such as ACT and Pre which are normally associated with access operations.

The sample timing circuit 108 of the controller 102 may use its own logic to determine when to provide the sampling command Cont_Sample. For example, similar to the sampling logic 118, the sample timing circuit 108 may provide the sampling command Cont_Sample with random timing, semi-random timing, pseudo-random timing, event-based timing, event counter-based timing, periodic timing, timing based on one or more signals, or combinations thereof. In some embodiments, the timing with which the sample timing circuit 108 provides the sampling command Cont_Sample may be independent of the timing logic in the sampling logic 118 of the memory 110. Accordingly, the sampling logic 118 may provide the signal ArmSample whenever the internal timing logic of the sampling logic 118 or the timing logic of the sample timing circuit 108 in the controller 102 indicates that the sampling signal ArmSample should be provided.

In some embodiments, the sampling command Cont_Sample may be specific to a subset of the memory cells of the memory array 112. For example, there may be a refresh control circuit 114 for each bank of the memory array 112. Each refresh control circuit 114 may have aggressor logic 116 to track aggressors for the associated bank. The sampling command Cont_Sample may specify one or more banks and the sampling signal ArmSample may be generated to sample an address for the aggressor logic 116 of that bank. In some embodiments, there may be a separate command Cont_Sample for each bank. For example, there may be a mode register for a sampling command Cont_Sample for each bank (e.g., a first register for a first bank, a second register for a second bank, etc.). In some embodiments, the sampling command Cont_Sample may include (or be accompanied by) information which specifies one or more banks. For example, the mode register may include a register associated with Cont_Sample and a register which stores one or more bank addresses.

In some embodiments, the memory 110 may provide feedback to indicate that an address has been sampled responsive to the sampling command Cont_Sample. For example, the memory 110 may provide a feedback signal to the controller 102 over one or more pins after the signal ArmSample is provided responsive to Cont_Sample (or after an address is actually sampled). In some embodiments, the memory 110 may use the mode register to provide feedback. For example, if the command Cont_Sample is written to the mode register at an active level, when the memory 102 services that command, the memory 102 may reset that register to an inactive level. The controller 102 may check the status of that register (e.g., via a mode register read command) to receive the feedback.

In some embodiments, the controller 102 may include an optional address tracking circuit 106. The address tracking circuit 106 may function in a manner similar to the aggressor logic 116, and may track addresses which are provided to the memory 110 to determine if any of those addresses are aggressors. The address tracking circuit 106 may provide an identified aggressor address Cont_HitXADD to the memory 110, which may then store the controller provided aggressor Cont_HitXADD so that the victims of that address may be refreshed. The controller provided aggressor address Cont_HitXADD may be provided in various ways. In some embodiments, similar to the signal Cont_Sample, the address Cont_HitXADD may be associated with a subset of the memory 110 (e.g., associated with one or more banks).

In some embodiments, the address Cont_HitXADD may be provided to the memory 110 as part of a mode register write operation. The controller 102 may write the address Cont_HitXADD to a register of the memory 110. The aggressor logic 116 may retrieve the address Cont_HitXADD from the mode register and then refresh its victims as part of a targeted refresh operation.

In some embodiments, the address Cont_HitXADD may be provided to the memory 110 along the CA bus. For example, the controller 102 may perform a special access operation and then provide the address Cont_HitXADD, but without one or more signals that would cause the memory 102 to actually perform an access on that address. In some embodiments, the controller 102 may provide the address Cont_HitXADD along with the sampling signal Cont_Sample, which may cause the refresh control circuit 114 to sample the address.

In some embodiments, the controller 102 may provide a refresh management signal RFM. The refresh management signal RFM may indicate that the memory 110 should perform a targeted refresh operation to refresh the victims of an identified aggressor (or in some situations, a different type of refresh operation). In some embodiments, when the controller 102 provides a controller identified aggressor address Cont_HitXADD, it may also provide the signal RFM, to cause the memory 110 to refresh the victims of that address.

In some embodiments, the victims of different identified aggressor addresses may be refreshed with different levels of priority. For example, the refresh control logic 114 may refresh the victims of controller identified aggressor addresses Cont_HitXADD with higher priority than aggressor address identified by the aggressor logic 116. For example, when a targeted refresh operation is performed, the refresh control circuit 114 may check if there is a received controller identified address Cont_HitXADD before refreshing the victims of memory identified aggressor addresses.

In some embodiments, the controller identified aggressor address Cont_HitXADD may be accompanied by an indicator of priority. For example, rather than prioritize every controller identified address Cont_HitXADD over memory identified aggressors, the controller 102 may provide the address Cont_HitXADD along with a signal (or other indicator) which determines whether the memory 110 treats the address with high priority or not. In some embodiments, the memory 110 may use internal logic to manage the priority of addresses.

In some embodiments, the memory 110 may receive the controller identified address Cont_HitXADD and may check to determine if that address had already been identified as an aggressor address by the aggressor logic 116 of the memory 110. For example, the memory 110 may store identified aggressors, and if the received address Cont_HitXADD matches one of the stored addresses, it may be discarded, and if it is not a match, the address Cont_HitXADD may be stored.

In some embodiments, the memory 110 may provide feedback to indicate to the controller 102 that the address Cont_HitXADD has been received (and/or to indicate that its victims have been refreshed). For example, similar to the feedback described above for the sampling command Cont_Sample, the feedback for Cont_HitXADD may include providing a signal along a pin and/or writing feedback status to an internal register (e.g., a mode register) of the memory 110. While two different feedback lines are shown, it should be understood that in some embodiments, the feedback for Cont_Sample and Cont_HitXADD may be provided using the same signaling pathway (e.g., the same pin, a mode register, etc.).

Figure 2:
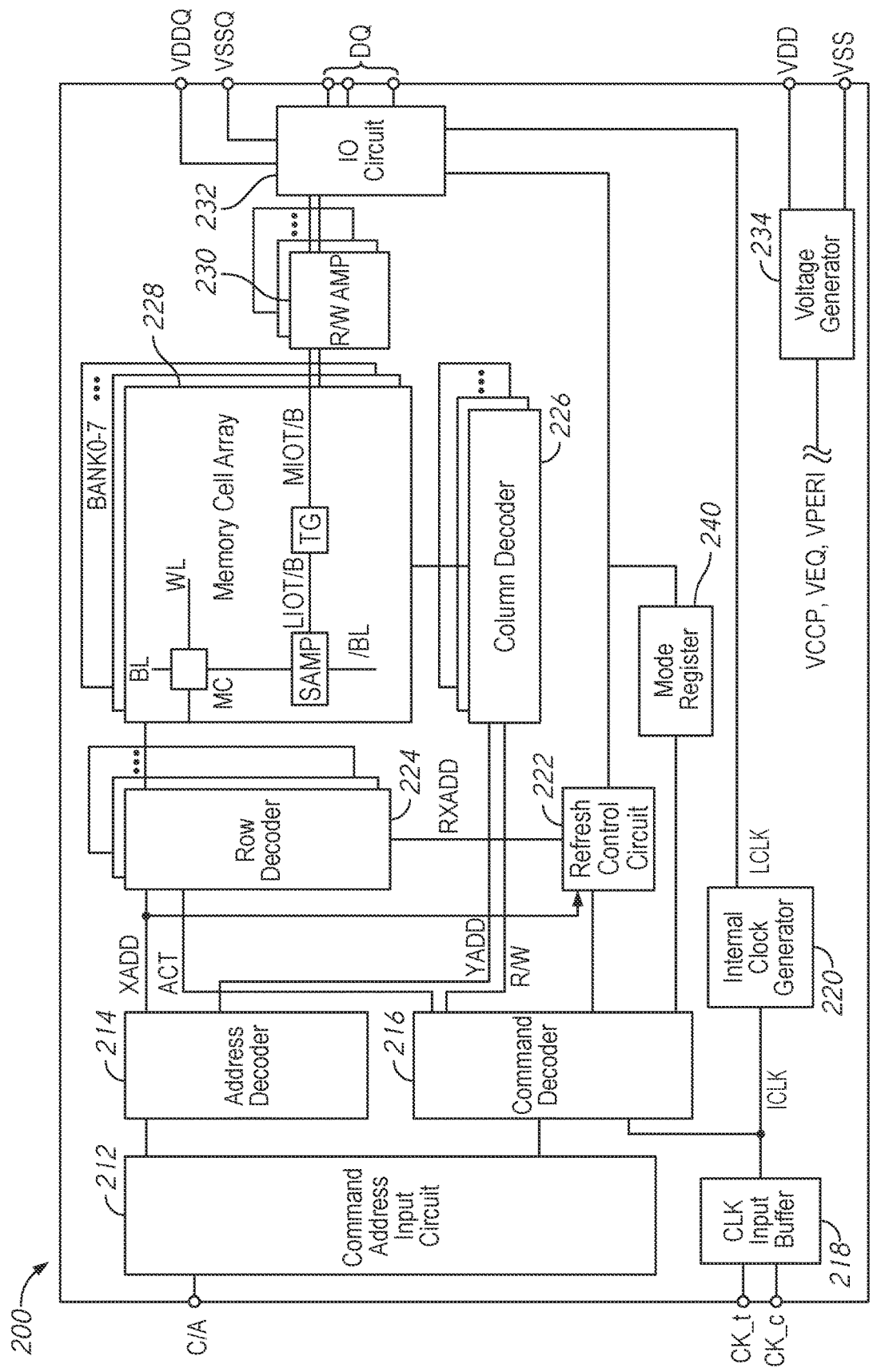
FIG. 2 is a block diagram of an apparatus according to some embodiments of the disclosure.

FIG. 2 is a block diagram of an apparatus according to some embodiments of the disclosure. The apparatus may be a semiconductor device 200, and will be referred to as such. The device 200 may be included in the memory 110 of FIG. 1. In some embodiments, the semiconductor device 200 may include, without limitation, a DRAM device.

The semiconductor device 200 includes a memory array 228. The memory array 228 is shown as including a plurality of memory banks. In the embodiment of FIG. 2, the memory array 228 is shown as including eight memory banks BANK0-BANK7. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 224 and the selection of the bit lines BL and /BL is performed by a column decoder 226. In the embodiment of FIG. 2, the row decoder 224 includes a respective row decoder for each memory bank and the column decoder 226 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers 230 over complementary local data lines (LIOT/B), transfer gate (TG), and complementary main data lines (MIOT/B). Conversely, write data outputted from the read/write amplifiers 230 is transferred to the sense amplifier SAMP over the complementary main data lines MIOT/B, the transfer gate TG, and the complementary local data lines LIOT/B, and written in the memory cell MC coupled to the bit line BL or/BL.

The semiconductor device 200 may employ a plurality of external terminals that include command and address (CA) terminals coupled to a command and address bus (e.g., 110 of FIG. 1) to receive commands and addresses, and clock terminals to receive clock signals CK_t and CK_c, and data clock signals WCK_t and WCK_c, and to provide access data clock signals RDQS_t and RDQS_c, data terminals DQ and DM, alert terminal ALERT to send/receive an alert signal, and power supply terminals to receive power supply potentials VDD, VSS, VDDQ, and VSSQ. The various terminals of the device 200 may generally be referred to as 'pins' and may be coupled to conductive elements which carry the signals to the pins. For example, there may be a number of CA pins, each of which may receive signals as voltages. Each CA pin may receive signals in a series format, with the voltage level varying over time to indicate different logic levels.

The clock terminals are supplied with external clock signals CK_t and CK_c that are provided to an input buffer 218. The external clock signals may be complementary. The input buffer 218 generates an internal clock ICLK based on the CK_t and CK_c clock signals. The ICLK clock is provided to the command decoder 216 and to an internal clock generator 220. The internal clock generator 220 provides various internal clock signals LCLK based on the ICLK clock. The LCLK clock signals may be used for timing operation of various internal circuits. In some embodiments, data clocks (not shown) may also be provided to control the operation of data being written to/read from the device 200.

The CA terminals may be supplied with memory addresses. The memory addresses supplied to the CA terminals are transferred, via a command/address input circuit 212, to an address decoder 214. The address decoder 214 receives the address and supplies a decoded row address XADD to the row decoder 224 and supplies a decoded column address YADD to the column decoder 226. The CA terminals may be supplied with commands. Examples of commands include timing commands for controlling the timing of various operations, access commands for accessing the memory, such as read commands for performing read operations and write commands for performing write operations, mode register write and read commands for performing write and read operations to a mode register 240, as well as other commands and operations.

The commands may be provided as internal command signals to a command decoder 216 via the command/address input circuit 212. The command decoder 216 includes circuits to decode the internal command signals to generate various internal signals and commands for performing operations. For example, the command decoder 216 may provide a row command signal ACT to select a word line and a column command signal R/W to select a bit line.

When a read command is received, and a row address and a column address are timely supplied with the read command, read data is read from memory cells in the memory array 228 corresponding to the row address and column address. The read command is received by the command decoder 216, which provides internal commands so that read data from the memory array 228 is provided to the read/write amplifiers 230. The read data is output to outside from the data terminals DQ via the input/output circuit 232.

When the write command is received, and a row address and a column address are timely supplied with the write command, write data supplied to the data terminals DQ is written to a memory cells in the memory array 228 corresponding to the row address and column address. A data mask may be provided to the data terminals DM to mask portions of the data when written to memory. The write command is received by the command decoder 216 which provides internal commands so that the write data is received by data receivers in the input/output circuit 232. The write data is supplied via the input/output circuit 232 to the read/write amplifiers 230, and by the read/write amplifiers 230 to the memory array 228 to be written into the memory cell MC.

The refresh control circuit 222 (e.g., refresh control circuit 114 of FIG. 1) may receive a refresh signal AREF. Responsive to each activation of the refresh signal AREF, the memory may refresh one or more word lines. For example, responsive to an activation of AREF, the refresh control circuit 222 may provide a number of 'pumps' each of which may be associated with one or more refresh addresses. The refresh addresses may be provided to the row decoder 224, which may refresh the word lines.

The refresh control circuit 222 may use internal logic to generate the refresh addresses. For example the refresh control circuit 222 may have a sequence generator which provides a refresh address from a sequence of refresh addresses. Refreshing addresses as part of a sequence of addresses may be referred to as an 'auto-refresh operation', and the refresh addresses generated as part of an auto-refresh operation may be referred to as auto-refresh addresses. In some embodiments, each auto-refresh address may be associated with more than one word line.

In some embodiments, the refresh control circuit 222 may additionally identify memory cells which are at risk of a faster rate of memory decay and refresh them out of sequence. For example, repeated accesses to a given row may cause nearby rows to experience faster information decay. The refresh control circuit 222 may identify these victim rows (e.g., based on access patterns or defined sampling methods) and refresh them as part of a targeted refresh operation. The victim addresses which are refreshed as part of a targeted refresh operation may be referred to as targeted refresh addresses. In some embodiments, a targeted refresh address may be associated with fewer word lines than an auto-refresh address.

While for brevity word lines and addresses are referred to as aggressors and victims, it should be understood that it is not necessary for an aggressor address to be causing increased data decay to nearby rows, or necessary for victims to be undergoing an increased rate of data decay. Instead, the aggressors may refer to addresses which have been identified by the memory's (and/or the controller's) logic.

Responsive to the refresh signal AREF, the refresh control circuit 222 may generate a number of pumps, and may perform a refresh operation responsive to each pump. The refresh control circuit 222 may determine if a given pump is associated with an auto-refresh operation or a targeted refresh operation. In some embodiments, the refresh control circuit 222 may determine which pump is what type of refresh operation based, in part, on whether a provided refresh address is a targeted refresh address or an auto-refresh address. In some embodiments, the device 200 may receive a refresh management signal RFM, which may cause the refresh control circuit 222 to perform one or more targeted refresh operations (e.g., whether or not one would have normally been performed). In some embodiments, receiving the RFM signal may interrupt other operations of the memory.

In some embodiments, the refresh control circuit may be repeated on a per bank basis, and accordingly the refresh control circuits 222 may track aggressor addresses on a per bank basis. For example in some embodiments, there may be a sampling signal (e.g., ArmSample) for each bank, and each bank may have its own address storage structure which independently stores identified aggressor addresses for the associated bank. Accordingly, the controller (e.g., 102 of FIG. 1) may provide a sampling command (e.g., Cont_Sample of FIG. 1) which specifies one or more banks, and/or may provide a controller identified aggressor address (e.g., Cont_HitXADD) which specifies one or more banks.

The memory 200 also includes a mode register 240, which may be used to store various information and/or settings to control operations of the memory 200. For example, during a mode register write operation, the memory may receive a mode register write command and data, which may be written to a specified register of the mode register 240. During a mode register read operation, the memory may receive a mode register read command and may retrieve the data stored in the specified register of the mode register 240. The memory 200 may perform various actions based on the state of information in the mode register 240 and may alter the data stored therein. For example, the address Cont_HitXADD may be written to the mode register 240 as part of a mode register write operation. The refresh control circuit 222 may then use the address Cont_HitXADD in the mode register 240, and may clear the address Cont_HitXADD in the mode register. During a subsequent mode register read operation, the controller may see that the value of Cont_HitXADD has been cleared, which may act as feedback to alert the controller that the address Cont_HitXADD was used.

The power supply terminals are supplied with power supply potentials VDD and VSS. The power supply potentials VDD and VSS are supplied to an internal voltage generator circuit 234. The internal voltage generator circuit 234 generates various internal potentials VCCP, VEQ, VPERI, and the like based on the power supply potentials VDD and VSS supplied to the power supply terminals.

The power supply terminals are also supplied with power supply potentials VDDQ and VSSQ. The power supply potentials VDDQ and VSSQ are supplied to the input/output circuit 232. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 232 so that power supply noise generated by the input/output circuit 232 does not propagate to the other circuit blocks.

Figure 3:
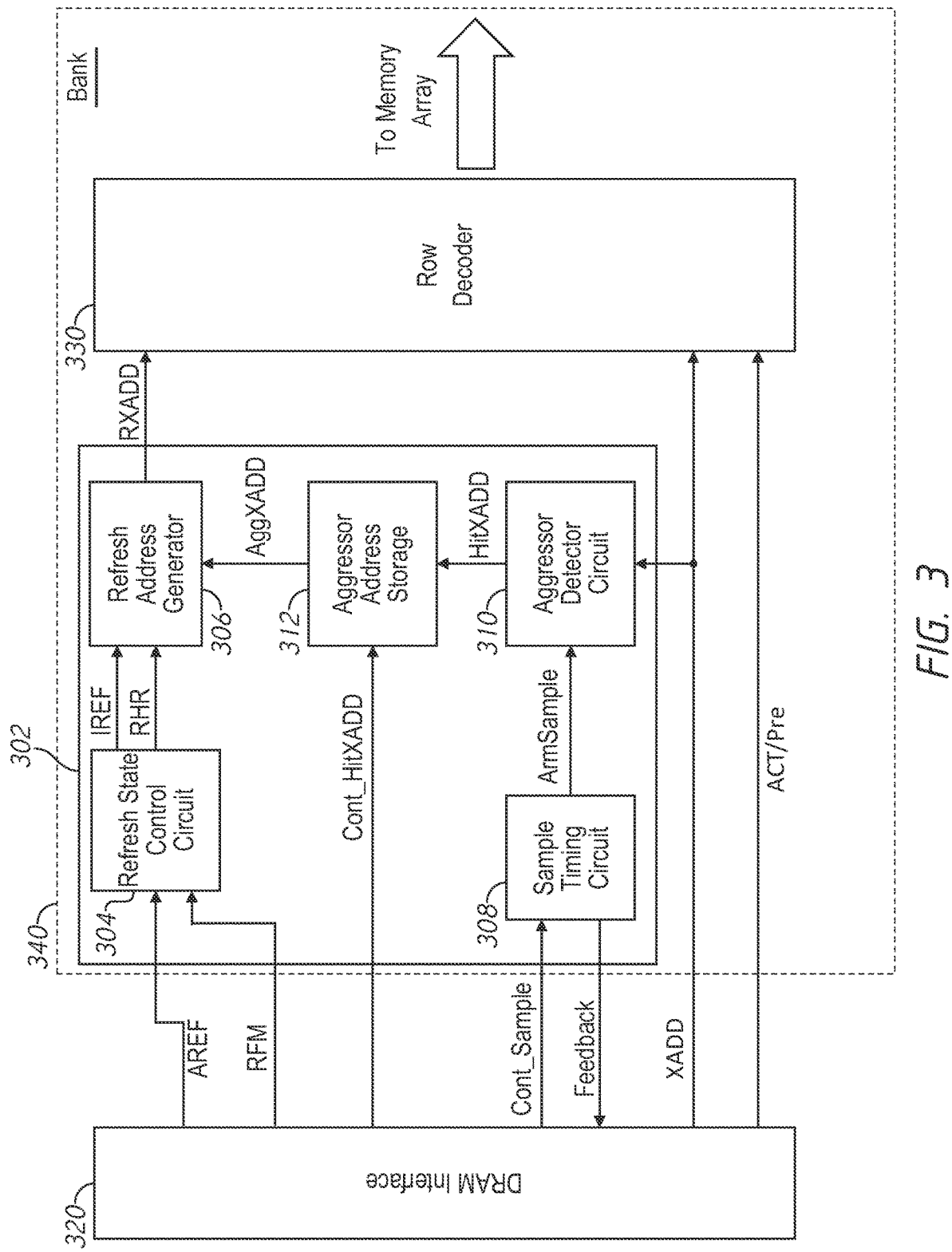
FIG. 3 is a block diagram of a refresh control circuit according to some embodiments of the present disclosure.

FIG. 3 is a block diagram of a refresh control circuit according to some embodiments of the present disclosure. The refresh control circuit 302 may, in some embodiments, be included in the refresh control circuit 114 of FIGS. 1 and/or 222 of FIG. 2. Also shown in FIG. 3 is row decoder 330, which may be included in the row decoder 224 of FIG. 2 and a DRAM interface 226, which may represent one or more components of the memory (e.g., 110 of FIG. 1 and/or 200 of FIG. 2), one or more components of the controller (e.g., 102 of FIG. 1), or combinations thereof.

The refresh control circuit 302 provides a refresh address RXADD which indicates one or more word lines of the memory array. The row decoder 330 may refresh the word lines indicated by the refresh address RXADD as part of a refresh operation. While not shown in FIG. 3, in some embodiments, the row decoder 330 may receive various signals (e.g., AREF, RHR, IREF, etc.) which indicates that the received address RXADD should be refreshed, and what type of refresh operation it is. The refresh control circuit 302 may receive various signals and addresses from the DRAM interface 320 which indicate the timing at which the refresh address RXADD should be provided, the type of refresh operation which should be performed, or otherwise be used to control the refresh process.

The refresh control circuit 302 includes a refresh state control circuit 304 which controls the timing of refresh operations responsive to a refresh signal AREF (and/or RFM) and determines the type(s) of refresh operation. A refresh address generator 306 provides the refresh address RXADD based, in part, on the type of refresh operation. If the refresh operation is a targeted refresh operation, then an identified aggressor address AggXADD may be retrieved from an address storage structure 312 and victim addresses may be calculated based on the aggressor address AggXADD to be provided as the refresh address RXADD. An aggressor detector circuit 310 may identify and provide aggressor addresses HitXADD to the address storage 312. Aggressor addresses may also be identified by the controller, and a controller identified addresses Cont_HitXADD may also be stored in the address storage 312. The aggressor detector circuit 310 may determine the aggressor addresses based, at least in part, on sampled addresses XADD off a row address bus (e.g., from the address decoder 214 of FIG. 2). The row addresses XADD may be sampled with timing based on a sampling signal ArmSample provided by a sample timing circuit 308. In addition to the internal logic of the sample timing circuit 308, a controller sampling command signal Cont_Sample may be provided and may also cause the sampling signal ArmSample to be provided.

The refresh control circuit 302 includes a refresh state control circuit 304. The refresh state control circuit 304 may be used to manage timing of refresh operations, and may also be used to manage which types of refresh operation are performed. The refresh state control circuit 304 may receive a refresh signal AREF from the DRAM interface 320 and may provide signals which cause a refresh operation to occur, and which indicate which type of refresh operation should occur. For example, an auto-refresh signal IREF may indicate an auto-refresh operation, while a targeted refresh signal RHR may indicate a targeted refresh operation.

It should be understood that while signals IREF and RHR are shown in FIG. 3, various schemes may be used to indicate refresh operations. For example, in some embodiments, a refresh signal IREF may be active any time a refresh operation occurs, and the signal RHR may be active to indicate a targeted refresh operation or inactive to indicate an auto-refresh operation. In some embodiments, the signal IREF may be active to indicate an auto-refresh operation and inactive otherwise, and the signal RHR may be active to indicate a targeted refresh operation and may be inactive otherwise. Other signaling schemes may be used in other embodiments.

In some embodiments, responsive to each activation of the refresh signal AREF, the refresh state control circuit 304 may provide a number of 'pumps' each of which may be associated with a refresh operation. For example, responsive to an activation (e.g., a pulse, a rising edge, etc.) of the signal AREF, the refresh state control circuit 304 may provide four refresh pumps, each of which may be an auto-refresh or targeted refresh operation. The refresh control circuit 302 may use various patterns of targeted and auto-refresh operation (e.g., 2 targeted refresh operation and 2 auto-refresh operations). In some embodiments, these patterns may span more than one activation of the refresh signal AREF. In some embodiments, the refresh state control circuit 304 may alter the pattern of targeted and auto-refresh operations.

In some embodiments, the refresh state control circuit 304 may receive a refresh management signal RFM from the interface 320. The signal RFM may be provided by a controller (e.g., 102). Responsive to the signal RFM, the refresh state control circuit 304 may enter a mode where targeted refresh operations (or an increased ratio of targeted to auto-refresh operations) are performed. In some embodiments, the signal RFM may be sent when the memory is not otherwise in a refresh mode. In some embodiments, one or more activations of the refresh signal AREF may be generated responsive to the signal RFM.

The refresh address generator 306 may generate a refresh address responsive to the indicated type of refresh operation (e.g., responsive to the signals IREF and RHR). When an auto-refresh operation is indicated (e.g., by the signal IREF being active), the refresh address RXADD may be an auto-refresh address. Each auto-refresh address may be associated with multiple word lines in the memory array. For example, the auto-refresh address may be truncated or compressed (e.g., fewer bits of information than a normal row address) and the auto-refresh address may be associated with every word line that shares its value in common. The refresh address generator 306 may include internal logic which determines a value of the auto-refresh address. Each time an auto-refresh signal is called for, the value of the auto-refresh address may be updated to a next value in a sequence (e.g., by incrementing a value of the row address).

When a targeted refresh operation is called for (e.g., responsive to the signal RHR being active), the refresh address generator 306 may retrieve an identified aggressor address AggXADD from an address storage structure 312. The refresh address generator 306 may calculate refresh addresses RXADD based on the aggressor address. For example, in some embodiments, the refresh address RXADD may represent victim rows which are physically adjacent to the aggressor (e.g., AggXADD+1 and AggXADD−1). In some embodiments, other relationships between the victims and the aggressor may be used (e.g., +/−2, +/−3, etc.).

The aggressor address storage structure 312 may be any data storage structure capable of storing a number of row addresses. The address storage structure 312 may store a number of row addresses which have been identified as aggressors (e.g., by the aggressor detector 310 and/or the controller). In some embodiments, the address storage structure 312 may have various markers of priority which indicate the order in which the addresses which are stored should be provided as the address AggXADD. In some embodiments, an address provided by the controller Cont_HitXADD may be given a higher priority than address HitXADD identified by the aggressor detector circuit 310.

In some embodiments, the controller may directly provide the controller identified aggressor address Cont_HitXADD. For example, the address Cont_HitXADD may be written into a mode register of the memory, and the stored address Cont_HitXADD may be retrieved into the address storage 312 from the mode register. In some embodiments, the controller may utilize the CA bus to provide the address Cont_HitXADD. For example, the controller may provide the address along the CA bus, and may provide the sampling command Cont_Sample to cause the refresh control circuit 302 to sample the address Cont_HitXADD off the bus. In some embodiments, the address Cont_HitXADD may pass through the aggressor detector circuit 310 rather than being directly provided to the aggressor address storage 312. In some embodiments where the address Cont_HitXADD is passed along the CA bus, the controller may perform a special operation which takes the form of an access command (e.g., a read/write) but is not actually associated with a read or write operation in the memory. For example, the address Cont_HitXADD may be provided along the CA bus, but various other commands may be provided (and/or omitted) to indicate that no access should be performed on the word lines associated with the address Cont_HitXADD.

In some embodiments, the memory may provide feedback to indicate that the victims of the address Cont_HitXADD provided by the controller have been refreshed. For example, the refresh control circuit 302 may provide some signal once the victims of Cont_HitXADD are refreshed. In some embodiments, the refresh control circuit 302 may write a value to a mode register (or reset a value in the mode register) to indicate that the victims of the address Cont_HitXADD have been refreshed.

The aggressor detector circuit 310 may identify if a row address XADD is an aggressor based on a pattern of accesses to that row address. This may be based on sampling of the value of the row address along the row address bus. When a sampling signal ArmSample is active, it may cause the aggressor detector circuit 310 to sample the next value of row address off the row address bus. The sample timing circuit 308 may provide activations of the signal ArmSample based on random timing, semi-random timing, pseudo-random timing, event-based timing, event counter-based timing, regular timing, counting activations of one or more other signals (e.g., ACT, Pre), or combinations thereof. The sample timing circuit 308 may also provide an activation of the signal ArmSample responsive to receiving the sampling command Cont_Sample from the controller.

In some embodiments, the sampling command Cont_Sample may be provided directly by the controller. In some embodiments, the sampling command Cont_Sample may represent a state written to a mode register of the memory. For example, the controller may write the Cont_Sample command to the mode register, and the sample timing circuit 308 may check the mode register to determine if the command Cont_Sample was written to the mode register, and may issue the sampling signal ArmSample along with the next access command (e.g., responsive to ACT).

In some embodiments, the sample timing circuit 308 may provide feedback to indicate that a row address was sampled responsive to the command Cont_Sample. For example, if the command Cont_Sample was stored in a mode register (e.g., 240 of FIG. 2), the sample timing circuit 308 may reset the state of the mode register to indicate that the command Cont_Sample was executed. Accordingly, the controller may access the mode register to determine if the command Cont_Sample was performed.

The aggressor detector circuit 310 may use one or more various methods to determine if a sampled address represents an aggressor address. In some embodiments, the sampled address may be used as an aggressor, and the aggressor detector circuit 310 may be omitted. In some embodiments, the sampled address may be stored in the aggressor detector circuit, and may be provided as an aggressor address may be provided as the address HitXADD if it is sampled a second time. In some embodiments, the aggressor detector circuit 310 may store sampled addresses and associate them with a counter, and each subsequent time that address is sampled, the counter may be changed. Based on a comparison of the counter to a threshold, the stored address may be identified as an aggressor address HitXADD. Various other schemes (and/or combinations of schemes) may be used by the aggressor detector circuit 310 to identify aggressor addresses.

The dotted line 340 represents components which may be repeated on a bank-by-bank basis. Accordingly, there may be refresh control circuit 302 and row decoder 330 for each bank of the memory. Thus, each aggressor address storage 312 may store identified aggressors which are associated with the bank that that refresh control circuit 302 is associated with. In some embodiments, when the controller provides the address Cont_HitXADD and the signal Cont_Sample it may provide them to all of the refresh control circuits 302 in common. In some embodiments, the controller may indicate which refresh control circuits 302 (e.g., which banks) the address Cont_HitXADD and the signal Cont_Sample are directed to.

Figure 4:
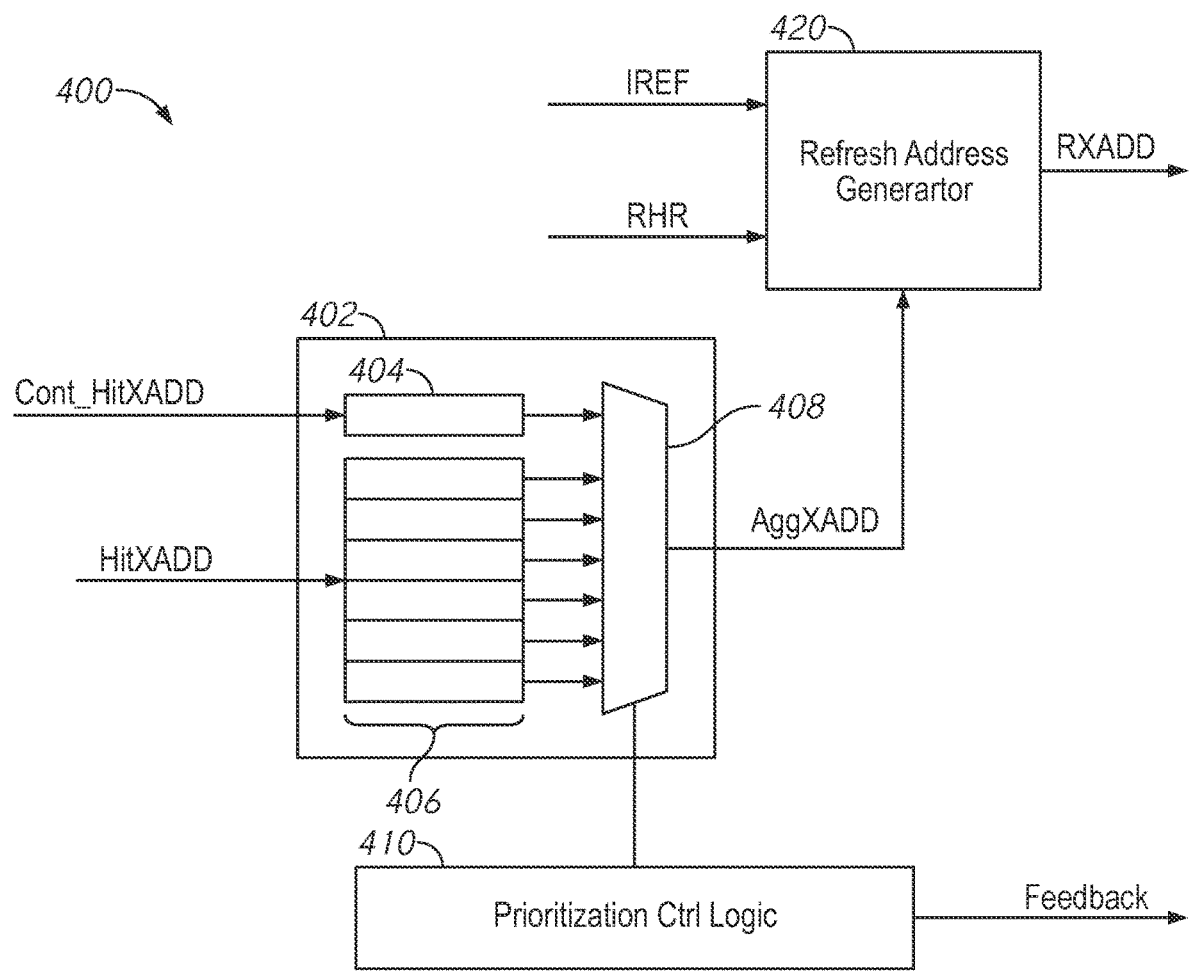
FIG. 4 is a block diagram of a refresh control circuit according to some embodiments of the present disclosure.

FIG. 4 is a block diagram of a refresh control circuit according to some embodiments of the present disclosure. The refresh control circuit 400 may, in some embodiments, be included in the refresh control circuit 114 of FIG. 1, 222 of FIG. 2, and/or 302 of FIG. 3. For the sake of brevity, certain components and operations of the refresh control circuit 400 which were already discussed with respect to the refresh control circuit(s) of previous figures will not be repeated again with respect to FIG. 4. For the sake of clarity, certain components of the refresh control circuit have been omitted from the view of FIG. 4.

The refresh control circuit 400 shows a simplified view of a refresh control circuit focused on the operation of an aggressor address storage structure 402. The address storage structure 402 includes a number of register slots, each of which stores an address. In some embodiments, the register may include content addressable memory (CAM) cells. In particular, the storage structure 402 of FIG. 4 includes a number of normal registers 406 and one or more priority registers 404. In some embodiments, the priority register 404 and normal registers 406 may be structurally similar, but may differ in how the address stored therein is handled.

The normal registers 406 may store addresses HitXADD provided by an aggressor detector circuit (e.g., 310 of FIG. 3). The priority register 404 may store an address Cont_HitXADD provided by the controller. In some embodiments, the controller may provide an indication as to whether the address Cont_HitXADD should be stored in the priority register 404. In some embodiments, the address Cont_HitXADD may automatically be stored in the priority register 404. In some embodiments, there may only be a single priority register 404. In some embodiments, there may be multiple priority registers. The address storage structure 402 includes a multiplexer or selector 408 which determines which of the stored addresses is provided as the identified aggressor address AggXADD to a refresh address generator 420 (e.g., refresh address generator 306 of FIG. 3). The selector may be controlled by a prioritization control logic circuit 410, which controls the order in which the addresses in the address storage structure 402 are provided.

If there is an address stored in the priority register 404, the prioritization logic 410 may direct the selector 408 to provide that address (e.g., Cont_HitXADD) as the aggressor AggXADD before any addresses in the normal registers 406 are provided. In some embodiments, where there is more than one priority register 404, various logic (e.g., FIFO, random, etc.) may be used to determine which of the controller identified addresses is provided first. If there are no controller identified addresses (e.g., if the priority register 404 is empty) then addresses from the normal registers 406 may be provided. The prioritization logic 410 may use various logic (e.g., FIFO, random, etc.) to determine the order in which to provide the addresses in the normal registers 406. When an address is provided as the aggressor AggXADD, it may be removed from the address storage structure 402 or marked as serviced, which may in turn signal that a new address may replace it.

The prioritization logic 410 may provide a feedback signal Feedback when the address in the priority register 404 is provided as the aggressor address AggXADD. In some embodiments, the feedback signal may be provided to a mode register, and the controller may determine a state of the feedback by performing a mode register read operation. In some embodiments, the feedback may be provided directly to the controller (e.g., via an I/O bus). In some embodiments, no feedback may be provided. The feedback may indicate if the victims of the controller identified aggressor Cont_HitXADD have been refreshed.

In some embodiments, the address Cont_HitXADD may be compared to the addresses which are already stored in the address storage structure 402. If there is a match (e.g., the address Cont_HitXADD was previously identified by the aggressor detector of the memory as an address HitXADD), it may indicate that the address is already in the queue for refreshing. In some embodiments, responsive to a match, the address Cont_HitXADD may be discarded. In some embodiments, the address which matched Cont_HitXADD may be given increased priority (e.g., moved to the priority register 404). In some embodiments, the memory (e.g., the prioritization logic 410) may be provide a feedback signal to indicate that the address Cont_HitXADD was already identified in the memory.

Figure 5:
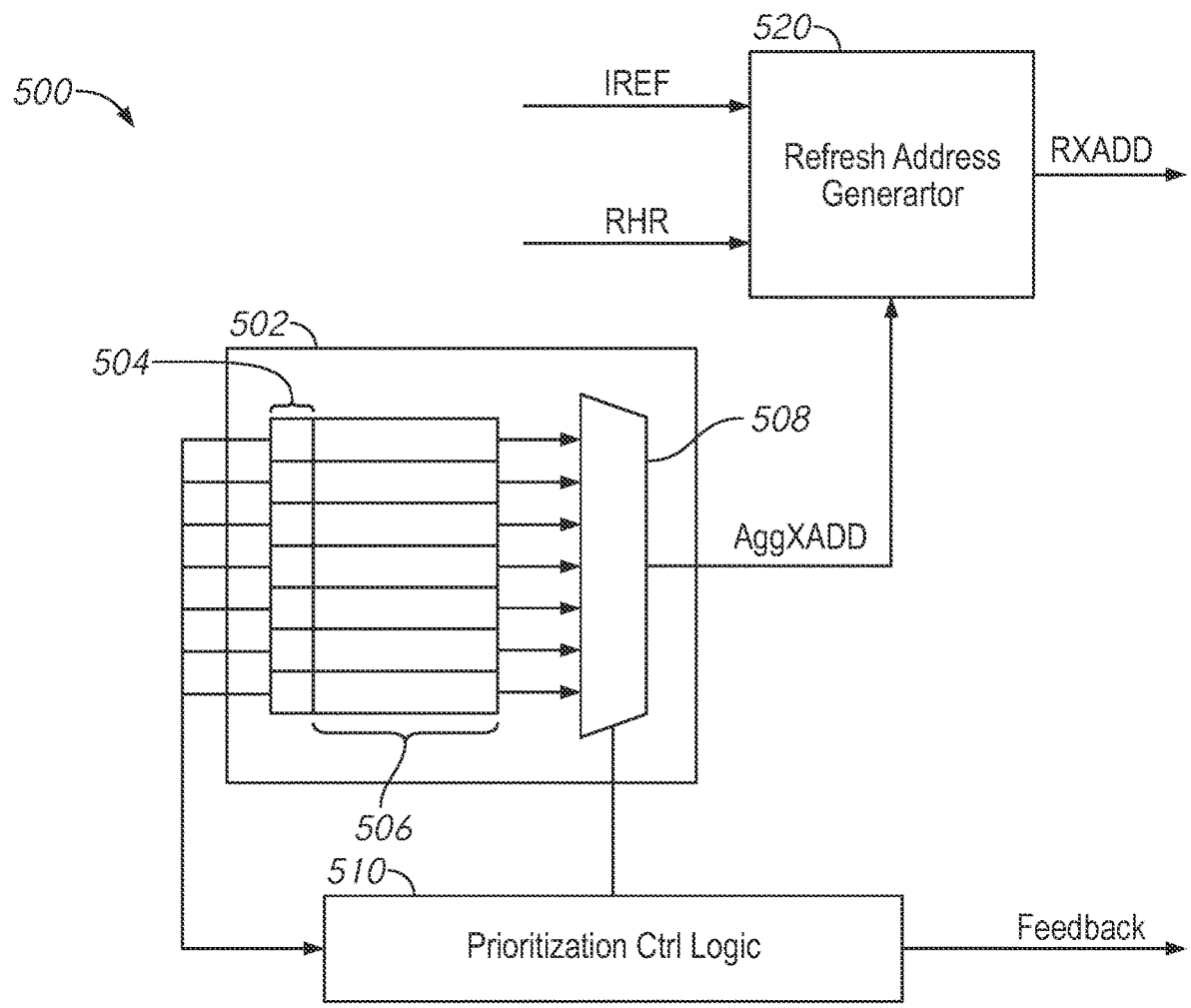
FIG. 5 is a block diagram of a refresh control circuit according to some embodiments of the present disclosure.

FIG. 5 is a block diagram of a refresh control circuit according to some embodiments of the present disclosure. The refresh control circuit 500 may, in some embodiments, be included in the refresh control circuit 114 of FIG. 1, 222 of FIG. 2, and/or 302 of FIG. 3. The refresh control circuit 500 may be generally similar to the refresh control circuit 400, and so for the sake of brevity, operations and components previously described with respect to the refresh control circuit 400 will not be repeated with respect to FIG. 5.

Rather than use a separate priority register (as in FIG. 4), the address storage 502 of FIG. 5 includes a number of register 506 each of which is associated with a priority marker 504. The priority marker 504 may indicate if the address in the associated register is high priority (e.g., a controller provided aggressor Cont_HitXADD) or a normal priority (e.g., the address HitXADD) aggressor address. In some embodiments, the priority markers 504 may be a single bit which indicates high priority or low priority. In some embodiments, other ways of marking priority may be used. In some embodiments, the priority markers 504 may also mark an order in which addresses should be provided, even within a type of address (e.g., an order in which addresses HitXADD should be provided).

The prioritization control logic 510 may update the state of the priority markers 504. In some embodiments, the priority may be based on the source of the address which is saved in the register. For example, if an address Cont_HitXADD is provided, the address may be stored in a register 506 and prioritization control logic 510 may mark the priority marker 504 associated with that register as a 'high priority'. When that address is removed from the register (e.g., by being provided as the address AggXADD), the priority marker 504 associated with that register may be reset.

In some embodiments, the controller may provide an indication of whether or not the address Cont_HitXADD should be a high priority address or not. For example, the controller may provide the address Cont_HitXADD along with a priority bit, which may be written as the priority marker 504 associated with the register 506 in which the address is stored. In some embodiments, if the address Cont_HitXADD matches an address already stored in the registers 506, its associated priority marker 504 may be set to active.

Figure 6:
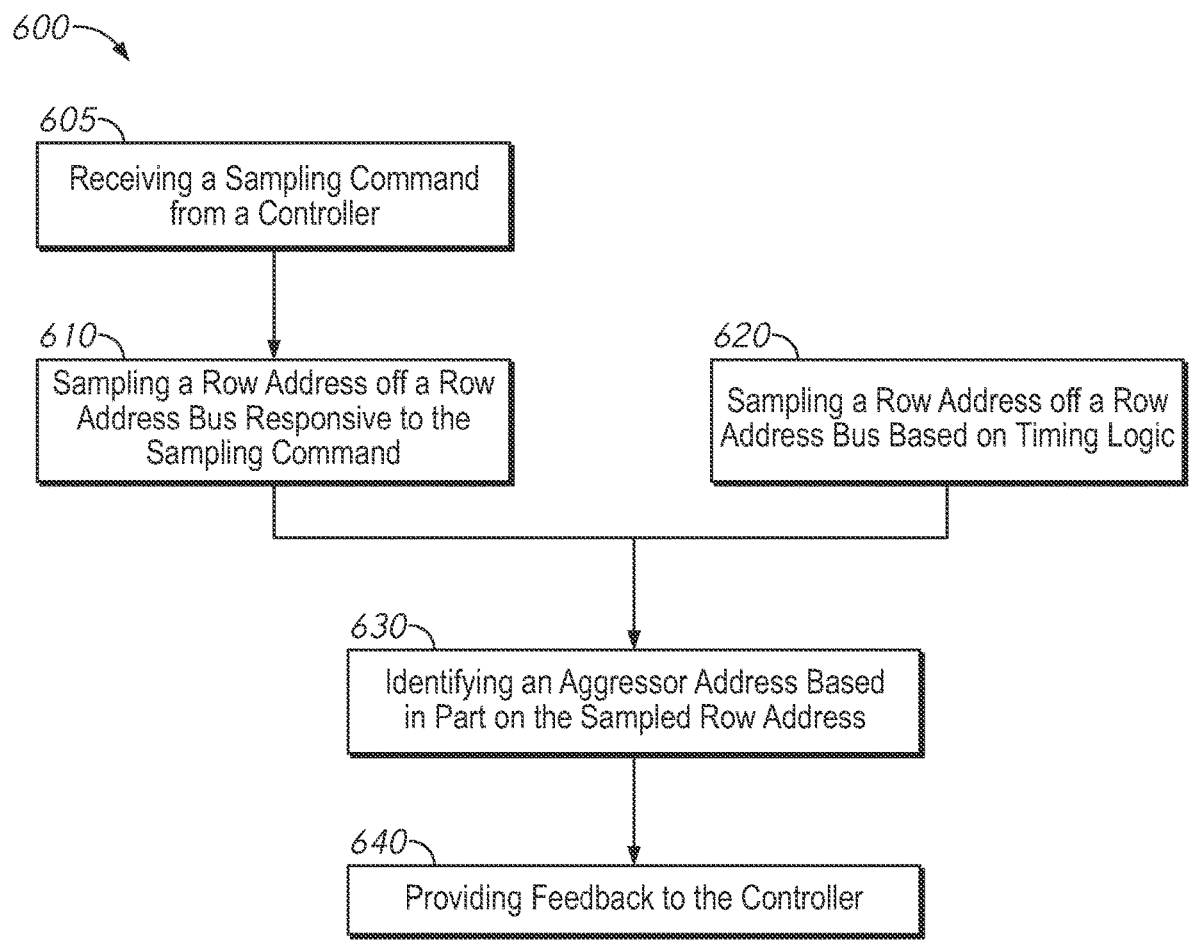
FIG. 6 is a block diagram of a method according to some embodiments of the present disclosure.

FIG. 6 is a block diagram of a method according to some embodiments of the present disclosure. The method 600 may, in some embodiments, be performed by one or more of the systems or apparatuses of FIGS. 1-5. The method 600 includes a method of sampling row addresses based on internal timing of the memory as well as sampling commands from the controller.

The method 600 includes blocks 605 which describes receiving a sampling command from a controller. The sampling command (e.g., Cont_Sample of FIGS. 1-5) may, in some embodiments, specify a bank of the memory. In some embodiments, the sampling command may be written to a mode register of the memory array.

Block 605 may generally be followed by block 610, which describes sampling a row address off a row address bus responsive to the sampling command. The memory may activate a sampling signal (e.g., ArmSample) which may cause a next row address to be captured. The row address may be provided by the controller as part of an access operation.

Block 620, which may happen independently as the steps described in boxes 605 and 610, describes sampling a row address off a row address bus based on timing logic. The timing logic may be internal to the memory (e.g., sample timing logic 308 of FIG. 3). The internal timing logic may cause a sampling signal (ArmSample) to be provided, and responsive to that, the row address may be sampled.

In some embodiments, as part of block 610, the method 600 may include checking if the row address was already going to be sampled (e.g., based on the steps of block 620). If so, then the sampling of block 610 may be suppressed, so that the same address isn't sampled twice.

Blocks 610 and 620 may be followed by block 630, which describes identifying an aggressor address based in part on the sampled row address. For example, the memory may count a number of times that a particular row address is sampled, and determine if the row address is an aggressor based on that count. Other schemes may also be used. The method 600 may also include refreshing one or more victim rows associated with the identified aggressor address.

Block 630 may be followed by optional block 640 which describes providing feedback to the controller. In some embodiments, the feedback of block 640 may follow block 605 and/or block 610. The feedback may include resetting a value in a mode register. The feedback may include providing a signal along one or more pins between the controller and memory.

Figure 7:
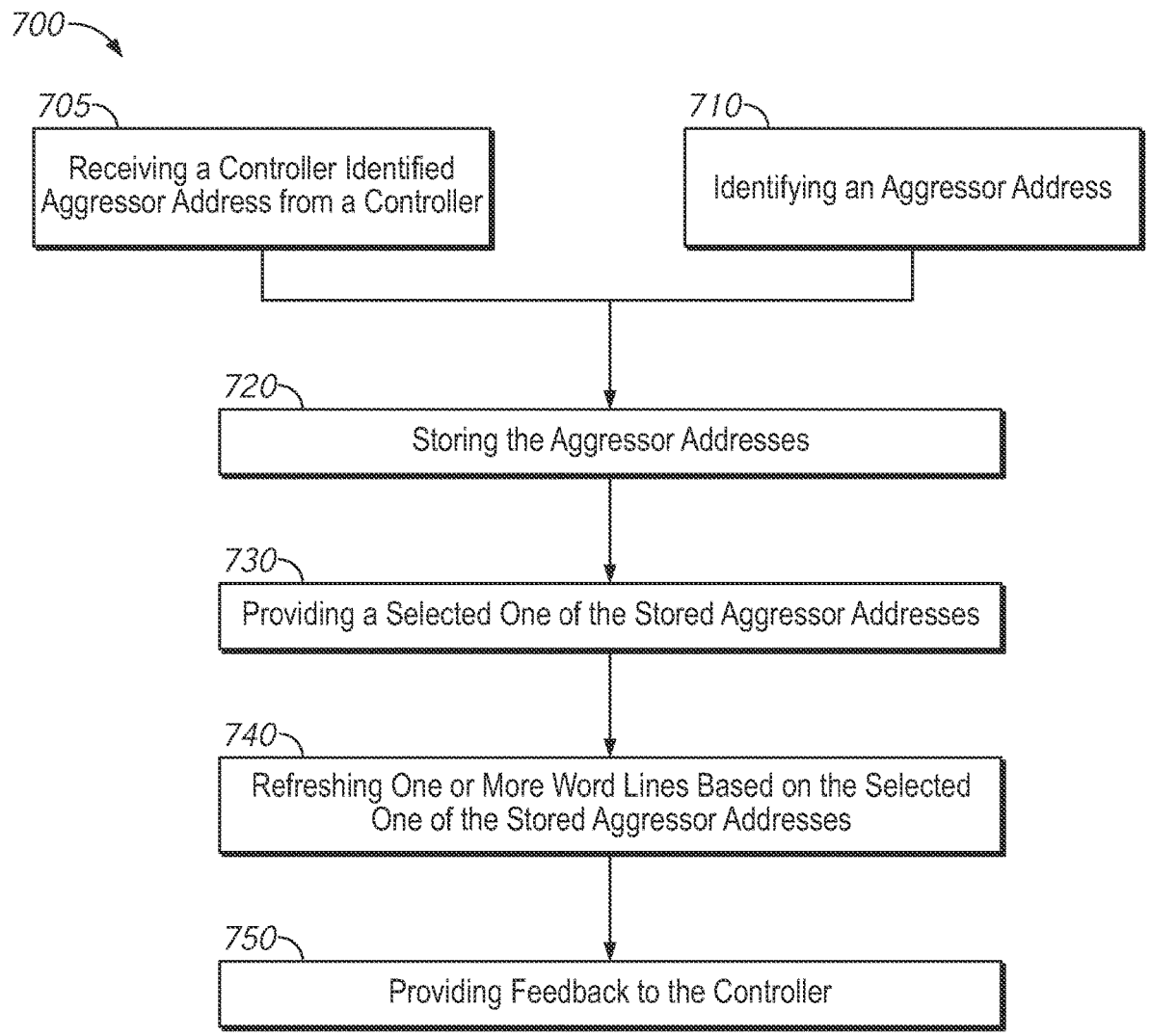
FIG. 7 is a block diagram of a method accordingly to some embodiments of the present disclosure.

FIG. 7 is a block diagram of a method accordingly to some embodiments of the present disclosure. The method 700 may, in some embodiments, be performed by one or more of the systems or apparatuses of FIGS. 1-5. The method 700 includes a method of receiving a controller identified aggressor address (e.g., Cont_HitXADD of FIGS. 1-5).

The method 700 may include block 705, which describes receiving a controller identified aggressor address from a controller. In some embodiments, the aggressor address may be written to a mode register of a memory. In some embodiments, the aggressor address may be provided along a command address (CA) bus. For example, the address may be provided along with a controller sampling command similar to the method 600 of FIG. 6. The method 700 may include identifying the aggressor address in the controller.

The method 700 may also include block 710, which describes identifying an aggressor address. The memory may include an aggressor detector circuit (e.g., 310 of FIG. 3) which may use various methods to determine aggressor addresses. In some embodiments, addresses may be sampled (e.g., the method 600 of FIG. 6), and the aggressor address may be determined based, in part on the sampled address. Blocks 705 and 710 may generally occur independently of each other.

Blocks 705 and 710 may generally be followed by block 720 which describes storing the aggressor addresses. The memory may include an aggressor address storage structure (e.g., 312 of FIG. 3) which may store aggressor addresses identified by the controller (e.g., Cont_HitXADD) and identified by the memory (e.g., HitXADD). In some embodiments, block 720 may include comparing a newly received address to the previously stored addresses. For example if the address Cont_HitXADD is already stored, then it may be discarded. In some embodiments, the storage structure may have certain registers reserved for controller identified aggressor addresses.

Block 720 may generally be followed by block 730, which describes providing a selected one of the stored aggressor addresses. In some embodiments, the memory may include some logic which prioritizes certain of the stored addresses (e.g., the controller identified addresses Cont_HitXADD) other addresses (e.g., memory identified addresses). In some embodiments, the controller may provide an indication of priority along with the address which may be received as part of block 705.

Block 730 may generally be followed by block 740, which describes refreshing one or more word lines based on the selected one of the stored aggressor addresses. This may be part of a targeted refresh operation. The word lines may be victims of the identified aggressors.

The method 700 may generally include block 750, which describes providing feedback to the controller. The feedback may be provided after block 740 (as shown) or at any other point in the method 700. Providing the feedback may include writing (or resetting) a value in a mode register and/or providing a signal to the controller along one or more pins.

It is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
    a memory array comprising a plurality of word lines each associated with a respective row address;
    a controller;
    a refresh control circuit comprising a sample timing circuit configured to provide a sampling signal at an active level based on timing logic of the sample timing circuit, wherein the refresh control circuit is separate from the controller, wherein the sample timing circuit is further configured to provide the sampling signal at the active level responsive to a sampling command signal received from a different sample timing circuit included in the controller, wherein the sampling signal causes detection of a row address when the sampling signal is at the active level, and
    wherein the refresh control circuit further comprises an aggressor detector circuit configured to identify an aggressor address based, in part, on the row address when the sampling signal is at the active level; and
    an aggressor address storage structure configured to store first aggressor addresses identified by the aggressor detector circuit and further configured to store second aggressor addresses received from the controller, wherein the second aggressor addresses are identified as aggressor addresses by the controller.

2. The apparatus of claim 1, further comprising a row decoder configured to refresh at least one address based on the stored aggressor addresses in the aggressor address storage structure.

3. The apparatus of claim 1, further comprising a mode register configured to store a value of the sampling command signal received from the controller.

4. The apparatus of claim 3, wherein after providing the sampling signal at the active level responsive to the sampling command signal, the value of the sampling command signal in the mode register is reset.

5. The apparatus of claim 1, wherein the timing logic of the sample timing circuit is configured to provide the sampling signal at the active level based on random timing, semi-random timing, pseudo-random timing, event-based timing, event counter-based timing, periodic timing, or combinations thereof.

6. A system comprising:
    a controller configured to provide a command along with a row address, wherein the controller includes a sample timing circuit configured to provide a sample command signal different from the command; and
    a memory comprising a refresh control circuit separate from the controller, wherein the refresh control circuit is configured to detect the row address responsive to the sample command signal provided by the sample timing circuit included in the controller, wherein the refresh control circuit is configured to detect the row address responsive to internal sampling logic of the refresh control circuit, wherein the refresh control circuit is configured to determine if the detected row address is an aggressor address, wherein the memory further comprises an aggressor address storage structure configured to store first aggressor addresses identified by the refresh control circuit and further configured to store second aggressor addresses received from the controller, wherein the second aggressor addresses are identified as aggressor addresses by the controller.

7. The system of claim 6, wherein the controller is further configured to identify a different aggressor address and provide it to the memory.

8. The system of claim 7, wherein the memory is further configured to store first aggressor addresses identified by the memory and second aggressor addresses provided by the controller, and configured to refresh at least one word line based on one of the stored first aggressor addresses or second aggressor addresses as part of a targeted refresh operation.

9. The system of claim 8, wherein the memory is configured to refresh a first word line of the at least one word line based on the second aggressor addresses provided by the controller before refreshing a second word line of the at least one word line based on the second aggressor addresses identified by the memory.

10. The system of claim 6, wherein the memory is configured to provide feedback to the controller after sampling the row address responsive to the sample command signal.

11. The system of claim 10, wherein the memory comprises a mode register, and wherein the controller is configured to write the sample command signal to the mode register.

12. The system of claim 6, wherein the memory is further configured to sample the row address based on timing logic of the memory.

13. An apparatus comprising:
a memory; and
a controller configured to provide commands and addresses to the memory along a CA bus,
configured to send and receive data along a DQ bus,
configured to identify an aggressor address based, in part, on the addresses provided to the memory along the CA bus, and provide the identified aggressor address to the memory, and
configured to provide a sampling command signal to the memory, wherein the sampling command signal is different from the commands, wherein the sampling command signal causes the memory to provide a sampling signal at an active level, wherein the memory comprises a refresh control circuit separate from the controller configured to provide the sampling signal at the active level based on timing logic of the refresh control circuit, wherein the sampling signal causes detection of a row address of the addresses when the sampling signal is at the active level, and wherein the memory comprises an aggressor address storage structure configured to store first aggressor addresses identified by the refresh control circuit and further configured to store second aggressor addresses received from the controller, wherein the second aggressor addresses are identified as aggressor addresses by the controller.

14. The apparatus of claim 13, wherein the controller is configured to provide the identified aggressor address along with the sampling command signal, and wherein the memory is configured to sample the identified aggressor address responsive to the sampling command signal.

15. The apparatus of claim 13, wherein the controller is configured to write the sampling command to a mode register of the memory.

16. The apparatus of claim 15, wherein the controller is configured to read a feedback signal from the mode register.

17. The apparatus of claim 13, wherein the controller is configured to provide a refresh management signal to the memory, and wherein the memory performs a targeted refresh operation responsive to the refresh management signal.

* * * * *